United States Patent [19]

Imura

[11] Patent Number: 5,656,975
[45] Date of Patent: Aug. 12, 1997

[54] PLL CIRCUIT HAVING FILTER WITH SWITCHED BIAS VOLTAGE FOR QUICK RESPONSE

[75] Inventor: Minoru Imura, Saitama, Japan

[73] Assignee: NEC Corporation, Tokyo, Japan

[21] Appl. No.: 621,603

[22] Filed: Mar. 26, 1996

[30] Foreign Application Priority Data

Jun. 2, 1995 [JP] Japan ................................ 7-136397

[51] Int. Cl.$^6$ ...................................................... H03L 7/10
[52] U.S. Cl. .................. 331/11; 331/14; 331/16; 331/17; 331/25
[58] Field of Search ................... 331/10, 11, 14, 331/16, 17, 25

[56] References Cited

U.S. PATENT DOCUMENTS

| 4,562,410 | 12/1985 | O'Rourke | 331/1 A |
|---|---|---|---|
| 4,980,652 | 12/1990 | Tarusawa et al. | 331/10 |
| 5,355,098 | 10/1994 | Iwasaki | 331/14 |
| 5,477,194 | 12/1995 | Nagakura | 331/10 |

FOREIGN PATENT DOCUMENTS

| 61-81027 | 4/1986 | Japan . |
| WO9305578 | 3/1993 | WIPO . |

*Primary Examiner*—Siegfried H. Grimm
*Attorney, Agent, or Firm*—Whitham, Curtis, Whitham & McGinn

[57] ABSTRACT

A PLL circuit is provided which has excellent quick response and noise resistance. A bias data memory circuit 7 previously stores frequency assignment data Da, for assigning the frequency of output signals S1 of VCO 1, as an address and the value, of a control voltage Vc corresponding to the assigned frequency, as bias data Db. A bias voltage production circuit 6 produces a bias voltage Vb of a voltage value provided by the bias data Db output from the bias data memory circuit 7. A switch control circuit 5 compares a phase difference voltage Vd, output from a phase comparison circuit 2, with the bias voltage Vb output from the bias voltage production circuit 6. In this case, if there is a voltage difference between the phase difference voltage Vd and the bias voltage Vb, the switch control circuit 5 turns a switch 4 on to feed the bias voltage Vb to a capacitor 32 of a loop filter, and when the phase difference voltage Vd has become close to the bias voltage Vb, the switch control circuit 5 turns the switch 4 off to stop the feed of the bias voltage Vb.

5 Claims, 2 Drawing Sheets

5,656,975

PLL CIRCUIT HAVING FILTER WITH SWITCHED BIAS VOLTAGE FOR QUICK RESPONSE

FIELD OF THE INVENTION

The present invention relates to a PLL (phase locked loop) circuit and particularly to a PLL circuit of which quick response and noise resistance are required.

BACKGROUND OF THE INVENTION

For PLL circuits, in general, a difference in phase between reference signals and output signals of VCO (voltage controlled oscillator) is detected, and a control voltage corresponding to the phase difference is produced and fed to VCO, thereby controlling the frequency. Further, a loop filter is provided to remove a high-frequency component contained in the control voltage, thereby permitting the circuit to be operated stably against noises.

In the above PLL circuits, increasing the time constant of the loop filter can reduce the high-frequency component contained in the control voltage in the VCO, resulting in enhanced noise resistance of the PLL loop. This, however, prolongs the lead-in (pull-in) time of the PLL loop, deteriorating the quick response. Therefore, devices using the above PLL circuit have the problem that, when the frequency is changed, the lead-in time exceeds the time limit, inhibiting normal operation.

On the other hand, one type of a conventional PLL circuit disclosed in the Japanese Patent Kokai No. 61-81027. This conventional PLL circuit comprises a VCO having two input terminals, to the first one of which a loop filter is connected, and to the second one of which a bias voltage control circuit is connected.

In operation, when a channel is newly set, the bias voltage control circuit generates a bias voltage corresponding to the newly set channel, and the generated bias voltage is applied to the second input terminal of the VCO, so that an output frequency of the VCO is instantly shifted to a predetermined frequency in response to the setting of the new channel.

In the conventional PLL circuit, however, there are disadvantages in that the VCO is required to have the two input terminals, and the VCO must be switched over between the two input terminals. As a result, the cost of the PLL circuit must be increased, and the structure of the VCO becomes complicated, because practically used VCOs can not be applicable thereto.

SUMMARY OF THE INVENTION

An object of the present invention is to provide a PLL circuit having excellent quick response and noise resistance.

Another object of the invention is to provide a PLL circuit in which any type of a practically used VCO can be adopted to suppress the increase of system fabrication cost.

According to the present invention, there is provided a PLL circuit comprising: A VCO for producing output signals of a frequency corresponding to a control voltage; a phase difference comparison circuit for detecting the difference in phase between reference frequency signals and output signals of the VCO to output a phase difference voltage; a low-pass filter, comprising a resistor and a capacitor, for removing a high-frequency component contained in the phase difference voltage to feed the resultant voltage as the control voltage to the VCO; memory means for pre-storing the frequency of the output signals of the VCO as an address and the control voltage value as bias data; bias voltage production means for producing a bias voltage based on the bias data output from the memory means; a switch for feeding the bias voltage to the capacitor of the low-pass filter; and switch control means for performing the on-off control of the switch, wherein the switch control means, in response to the phase difference voltage and the bias voltage, compares these voltages with each other and, if there is a difference in voltage between the phase difference voltage and the bias voltage, turns the switch on to feed the bias voltage to the capacitor of the low-pass filter, and, when the phase difference voltage has become close to the bias voltage, turns the switch off to stop the feed of the bias voltage.

The PLL circuit may further comprise bias data production means which, in response to the control voltage fed to the VCO, produces the bias data and outputs the bias data to the memory means.

PREFERRED EMBODIMENTS OF THE INVENTION

Embodiments of the present invention will now be described with reference to the accompanying drawings.

Figure 1:
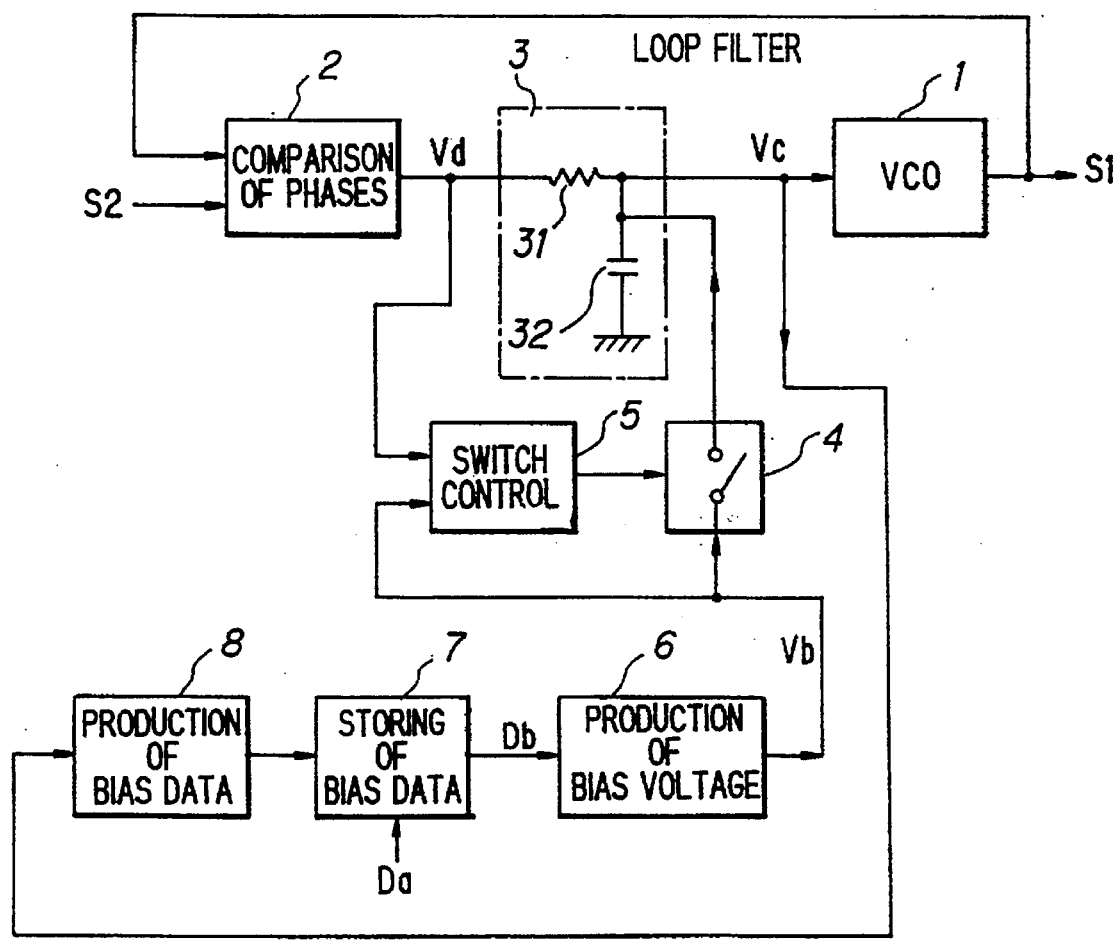
FIG. 1 is a block diagram showing one embodiment of the present invention.

FIG. 1 is a block diagram showing one embodiment of the present invention. In this embodiment, a PLL loop comprises: VCO (voltage controlled oscillator circuit) 1 for controlling the frequency according to a control voltage Vc and producing output signals S1; a phase difference comparison circuit 2 for detecting a difference in phase between reference frequency signals S2 and output signals S1 of VCO and outputting a phase difference voltage Vd according to the phase difference; and a loop filter 3 for removing a high-frequency component contained in the phase difference voltage Vd and outputting the control voltage Vc. When the frequency of the output signals S1 is switched to a desired frequency, the frequency of the reference frequency signals S2 may be switched to a desired frequency.

Alternatively, a variable frequency divider circuit for dividing the frequency of output signals S1 of VCO 1 in a predetermined ratio may be provided, and the frequency division output may be input into a phase comparator 2. Further, a charge pump circuit for performing charge and discharge by means of pulse signals may be provided between the phase comparator 2 and the loop filter 3.

The loop filter 3 is a low-pass filter comprising a resistor 31 and a capacitor 32, and a bias voltage Vb is fed through a switch 4 to the capacitor 32. The on-off control of the switch 4 is performed by a switch control circuit 5. A bias data memory circuit 7 is a memory for previously storing the value of the control voltage Vc corresponding to the frequency of output signals S1 of VCO 1 and stores frequency assignment data Da, for assigning the frequency of the output signals S1, as an address and the value of control voltage Vc, corresponding to the assigned frequency, as bias data Db. A bias voltage producing circuit 6 is a kind of D-A converter which produces a bias voltage Vb of a voltage value provided by the bias data Db output from the bias data memory circuit 7. The bias voltage Vb is the same voltage value as the control voltage Vc at which the output signals S1 of VCO 1 are brought to a frequency assigned by the frequency assignment data Da.

A switch control circuit 5 performs control in such a manner that a switch 4 is in the state of "on" during a period between the turning on of the power of the equipment or the switching of the frequency and the actuation of the PLL circuit and, upon the actuation of the PLL circuit, the switch 4 is turned off. For this purpose, the phase difference voltage Vd output from the phase comparison circuit 2 is compared with the bias voltage Vb output from the bias voltage producing circuit 6. In this case, setting is performed in such a manner that when there is a difference in voltage between the phase difference voltage Vd and the bias voltage Vb, the switch 4 is turned on, while when the phase difference voltage Vd has become close to the bias voltage Vb, the switch 4 is turned off. The actuation of the PLL circuit refers to such a state that the "lead-in" operation of the PLL circuit has been completed and output signals having a desired frequency can be output.

A bias data production circuit 8 is provided in order to previously store bias data in the bias data memory circuit 7 and has an A-D conversion function by which, in response to the control voltage Vc of VCO 1, digital data are converted. In storing the bias data, the switch 4 is turned off, and the control voltage Vc is set so that the output signals S1 of VCO 1 have a desired frequency. In this case, the frequency assignment data Da having a desired frequency are used as an address, and the output data of the bias data producing circuit 8 are stored in the bias data memory circuit 7.

Figure 3:
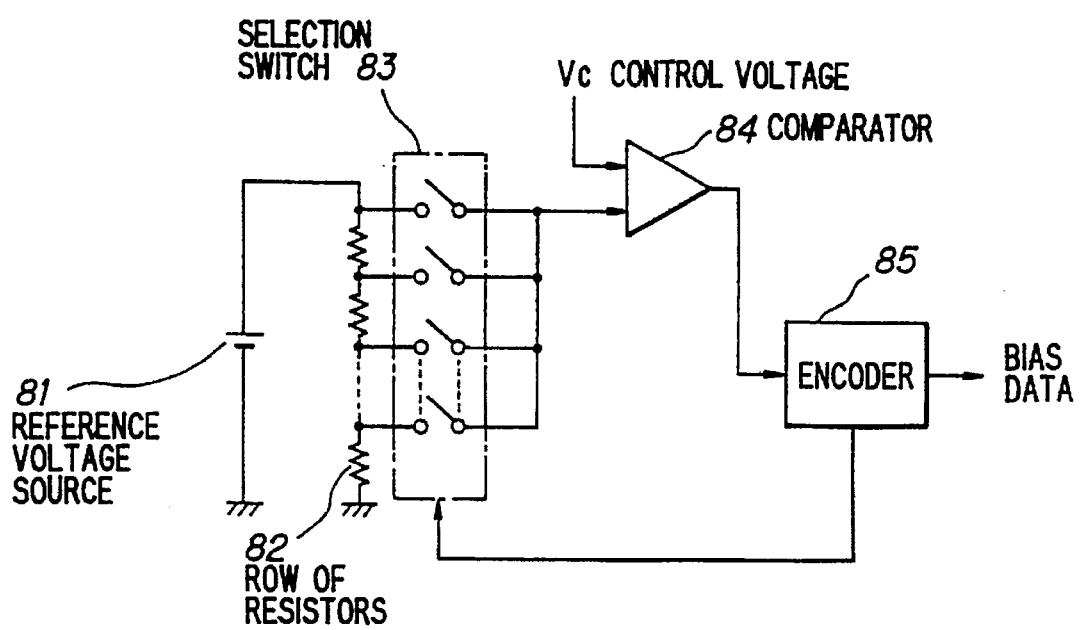
FIG. 3 is a block diagram showing one embodiment of a bias data producing circuit 8.

For example, as shown in FIG. 3, the bias data producing circuit 8 comprises: a reference voltage source 81 for producing a reference voltage; a row of resistors 82 comprising a plurality of resistors for dividing the reference voltage; a selection switch 83 for selecting a tap of the row of resistors 82; a comparator 84 for comparing the output voltage of the selection switch 83 with the control voltage Vc; and an encoder 85 which controls the selection switch 83 so as for the output voltage of the selection switch 83 to be equal to the control voltage Vc and, at the same time, outputs a value, corresponding to the selected switch, as bias data.

The operation for switching of the frequency of the output signals S1 will be described.

At the outset, frequency assignment data Da which assign the output frequency of VCO 1 are input into the bias data memory circuit 7. The bias data memory circuit 7 outputs pre-stored bias data Db corresponding to the frequency assignment data Da. In response to the bias data Db, the bias data producing circuit 8 produces a bias voltage Vb corresponding to the control voltage Vc corresponding to the assignment frequency.

In this case, a difference occurs between the phase difference voltage Vd output from the phase comparison circuit 2 and the bias voltage Vb output from the bias voltage producing circuit 6, and, hence, the switch control circuit 5 turns the switch 4 on. The bias voltage Vb is fed through the switch 4 to the capacitor 32 of the loop filter 3 to charge the capacitor 32 in a short time and applied to VCO 1. The VCO 1, in response to the bias voltage Vb, outputs output signals S1 having a frequency close to the assigned frequency. Thereafter, when the phase difference voltage Vd has become close to the bias voltage Vb, the switch control circuit 5 turns the switch 4 off to bring the PLL circuit to an actuated state and to stabilize the frequency.

Figure 2:
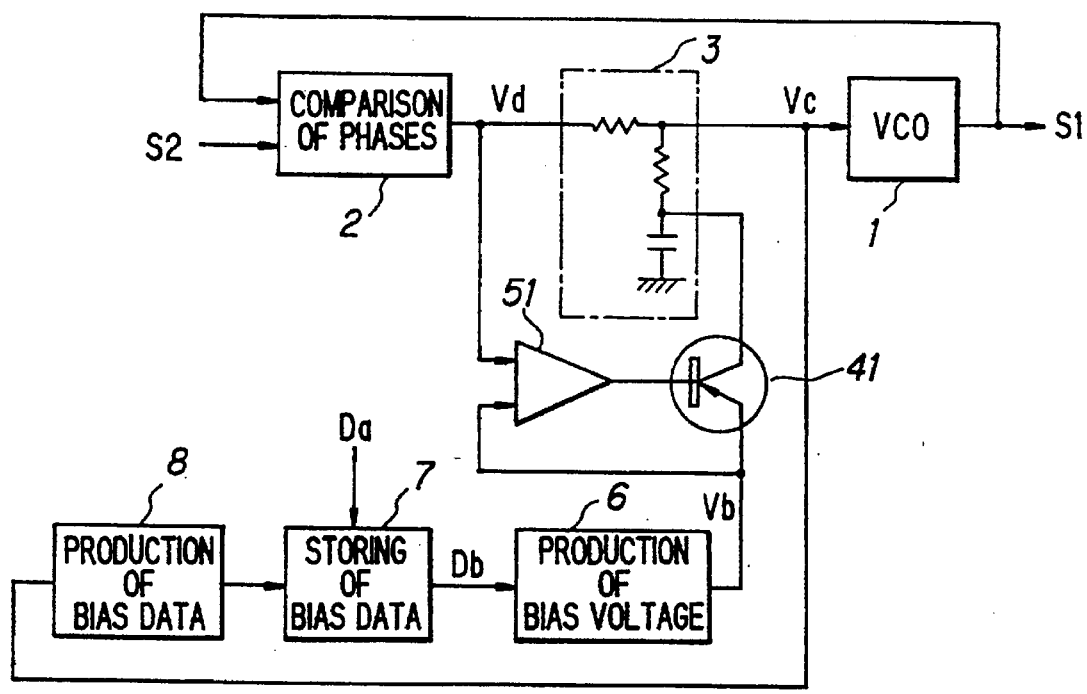
FIG. 2 is a block diagram showing another embodiment of the present invention.

FIG. 2 is a block diagram showing another embodiment of the present invention, wherein a transistor is used as a switch. In this embodiment, a comparator 51 compares a phase difference voltage Vd with a bias voltage Vb and controls the base current of a transistor 41 to perform on-off control. A resistor is connected in series with a capacitor to constitute a loop filter. As described above, according to the present invention, a control voltage corresponding to the output frequency of VCO 1 is pre-stored in a memory, and, before the PLL circuit is brought to an actuated state, the corresponding control voltage value is read out from the memory to produce a bias voltage, identical to the corresponding control voltage, which is then fed through a switch to a capacitor of a loop filter to perform charging in a short time. Thereafter, when the control voltage produced by the PLL circuit has become close to the bias voltage, the switch is turned off to stop the feed of the bias voltage. The above constitution, even when the time constant of the loop filter is increased in order to enhance the noise resistance, can shorten the lead-in time of the PLL circuit and enhance the quick response.

Although the invention has been described with respect to specific embodiment for complete and clear disclosure, the appended claims are not to be thus limited but are to be construed as embodying all modification and alternative constructions that may occur to one skilled in the art which fairly fall within the basic teaching here set forth.

What is claimed is:

1. A PLL circuit comprising:
    a VCO for producing output signals of a frequency corresponding to a control voltage;
    a phase difference comparison circuit for detecting the difference in phase between reference frequency signals and output signals of the VCO to output a phase difference voltage;
    a low-pass filter, comprising a resistor and a capacitor, for removing a high-frequency component contained in the phase difference voltage to feed the resultant voltage as the control voltage to the VCO;
    memory means for pre-storing the frequency of the output signals of the VCO as an address and the control voltage value as bias data;
    bias voltage production means for producing a bias voltage based on the bias data output from the memory means;
    a switch for feeding the bias voltage to the capacitor of the low-pass filter; and
    switch control means for performing the on-off control of the switch,
    wherein the switch control means, in response to the phase difference voltage and the bias voltage, compares these voltages with each other and, if there is a difference in voltage between the phase difference voltage and the bias voltage, turns the switch on to feed the bias voltage to the capacitor of the low-pass filter, and, when the phase difference voltage has become close to the bias voltage, turns the switch off to stop the feed of the bias voltage.

2. The PLL circuit according to claim 1, which further comprises bias data production means which receives the control voltage fed to the VCO to produce the bias data and outputs the bias data to the memory means.

3. The PLL circuit, according to claim 1, wherein:
    the switch is a switching transistor; and
    the switch control means is a comparator for comparing the phase difference and bias voltages.

4. The PLL circuit, according to claim 2, wherein:

the bias data production means, comprises: a reference voltage source for producing a reference voltage; means for dividing the reference voltage to provide a divided voltage; means for determining a level of the divided voltage; a comparator for comparing the divided voltage and a control voltage to provide a compared signal; and a decoder for producing the bias data in accordance with the compared signal, the decoder controlling the determining means to equalize the level of the divided voltage and the control voltage.

5. The PLL circuit, according to claim 4, wherein:

the dividing means comprises a serial connection of resistors; and the determining means is a selector for selecting one of serial connection modes of the resistors to determine the level of the divided voltage.

* * * * *